US008766409B2

United States Patent
Yu

(10) Patent No.: US 8,766,409 B2
(45) Date of Patent: *Jul. 1, 2014

(54) METHOD AND STRUCTURE FOR THROUGH-SILICON VIA (TSV) WITH DIFFUSED ISOLATION WELL

(75) Inventor: Chi-Yeh Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

This patent is subject to a terminal disclaimer.

(21) Appl. No.: 13/167,909

(22) Filed: Jun. 24, 2011

(65) Prior Publication Data

US 2012/0326319 A1 Dec. 27, 2012

(51) Int. Cl.
*H01L 29/40* (2006.01)
*H01L 23/04* (2006.01)
*H01L 23/48* (2006.01)
*H01L 21/768* (2006.01)

(52) U.S. Cl.
CPC ....... *H01L 23/481* (2013.01); *H01L 2223/6616* (2013.01); *H01L 2223/6622* (2013.01); *H01L 21/76898* (2013.01)
USPC .................. 257/621; 257/698; 257/E23.067; 438/667

(58) Field of Classification Search
CPC ............ H01L 21/76898; H01L 23/481; H01L 2924/00; H01L 2924/00014; H01L 2324/00013; H01L 2924/10253; H01L 2223/6616; H01L 2223/6622
USPC ........... 257/276, 621, 698, E23.067; 438/667
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,107,149 A * | 8/2000 | Wu et al. ........................ 438/303 |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |

(Continued)

*Primary Examiner* — Julio J Maldonado
*Assistant Examiner* — Cory Eskridge
(74) *Attorney, Agent, or Firm* — Duane Morris LLP

(57) ABSTRACT

A semiconductor device and method for forming the same provide a through silicon via (TSV) surrounded by a dielectric liner. The TSV and dielectric liner are surrounded by a well region formed by thermal diffusion. The well region includes a dopant impurity type opposite the dopant impurity type of the substrate. The well region may be a double-diffused well with an inner portion formed of a first material and with a first concentration and an outer portion formed of a second material with a second concentration. The surrounding well region serves as an isolation well, reducing parasitic capacitance.

13 Claims, 4 Drawing Sheets

(56) References Cited

U.S. PATENT DOCUMENTS

| | | |
|---|---|---|
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2010/0237386 A1* | 9/2010 | Lin et al. ............ 257/173 |
| 2011/0108948 A1* | 5/2011 | Kim et al. ............ 257/532 |
| 2012/0061795 A1* | 3/2012 | Yen et al. ............ 257/516 |

* cited by examiner

METHOD AND STRUCTURE FOR THROUGH-SILICON VIA (TSV) WITH DIFFUSED ISOLATION WELL

FIELD OF THE INVENTION

The disclosure relates to through-silicon via (TSV) structures used in semiconductor integrated circuit devices, and methods for making the same. More particularly, the disclosure relates to a method and structure for a TSV with a diffused isolation well.

BACKGROUND

In today's rapidly advancing semiconductor manufacturing industry, through-silicon vias, (TSVs), are key elements in integrated circuit packaging technology. TSVs are vias that extend completely through the semiconductor substrate, commonly a silicon wafer, to allow chip-to-chip interconnect schemes or wafer-to-wafer interconnect schemes compatible with 3D wafer-level packaging. The TSVs are filled with conductive material, and connective pads or other structures are formed on top and bottom of the conductive material, i.e. on the upper and lower opposed surfaces on the semiconductor substrate. This arrangement enables individual die to be stacked over one another and coupled to one another or other components, without the use of wire bonding.

The conductive material extending through and filling the TSV is conventionally surrounded by a dielectric layer which serves to isolate the filled TSV from the substrate. The dimensions of the TSVs that extend completely through the substrates are great compared to the interconnect features of the semiconductor device such as the vias formed within the semiconductor devices and which connect the different levels of metallization to one another through dielectric material within the semiconductor devices. As a result of the enormous size of the TSV, the parasitic capacitance created in the dielectric layer surrounding the TSV is significant and creates vulnerability to substrate noise.

Conventional attempts to correct for or compensate for the large parasitic capacitance have typically required extra shielding which, in turn, requires additional masking operations and this significantly lowers throughput and increases costs. The present disclosure is directed to addressing these shortcomings and reducing parasitic capacitance.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 4A is a cross-sectional view and FIG. 4B is a top, plan view taken along line 4B-4B of FIG. 4A;

DETAILED DESCRIPTION

The disclosure provides a TSV structure surrounded by a diffused insulation well that reduces parasitic capacitance effects brought about by the TSV when it is filled with a conductive material and used to provide interconnection between the integrated circuit chip and vertically stacked components. The diffusion well may include a concentration gradient of one dopant impurity. The diffusion well may be formed by one or multiple diffusion operations and therefore may include an inner well section and an outer well section, the inner and outer well sections being the same or a different dopant impurity type, according to various exemplary embodiments.

Figure 1:
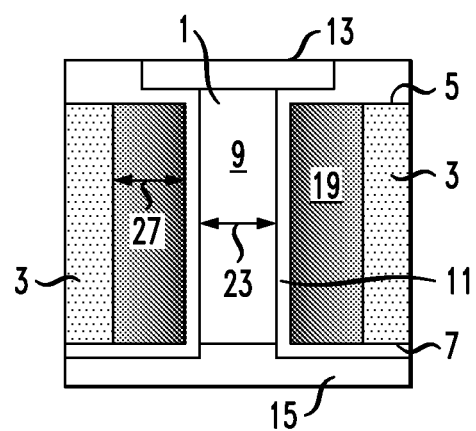
FIG. 1 is a cross-sectional view of an exemplary filled TSV structure according to the disclosure.

FIG. 1 is a cross-sectional view showing an exemplary filled TSV structure 1. TSV structure 1 is a filled through-silicon via (TSV) opening that extends from top surface 5 to lower surface 7 of substrate 3. TSV structure 1 is filled with conductive material 9. Substrate 3 may be a silicon, silicon germanium, or other suitable semiconductor substrate used in the semiconductor manufacturing industry and substrate 3 may be a p-type or an n-type substrate material. The opening that extends through substrate 3 and is filled with conductive material 9, includes width 23. Dielectric material 11 surrounds conductive material 9 and well region 19 having width 27 surrounds dielectric material 11. According to various exemplary embodiments, substrate 3 may be of a first dopant impurity type and well region 19 will be formed of the opposite, i.e. second dopant impurity type. Well region 19 may include a concentration gradient as a concentration of dopant impurity is greater in the area adjacent dielectric layer 11 and conductive material 9, than it is at locations further from dielectric layer 11 and conductive material 9, i.e. concentration increases closer to the filled TSV. Conductive contact pads 13 and 15 connect conductive material 9 to other components (not shown) that may be stacked above and below filled TSV structure 1 formed in substrate 3. These contact pads 13 and 15 formed on top surface 5 and bottom surface 7, respectively, enable the integration of and integrated circuit or other semiconductor device formed in substrate 3 to other components disposed above and below TSV structure 1 of substrate 3.

Figure 2:
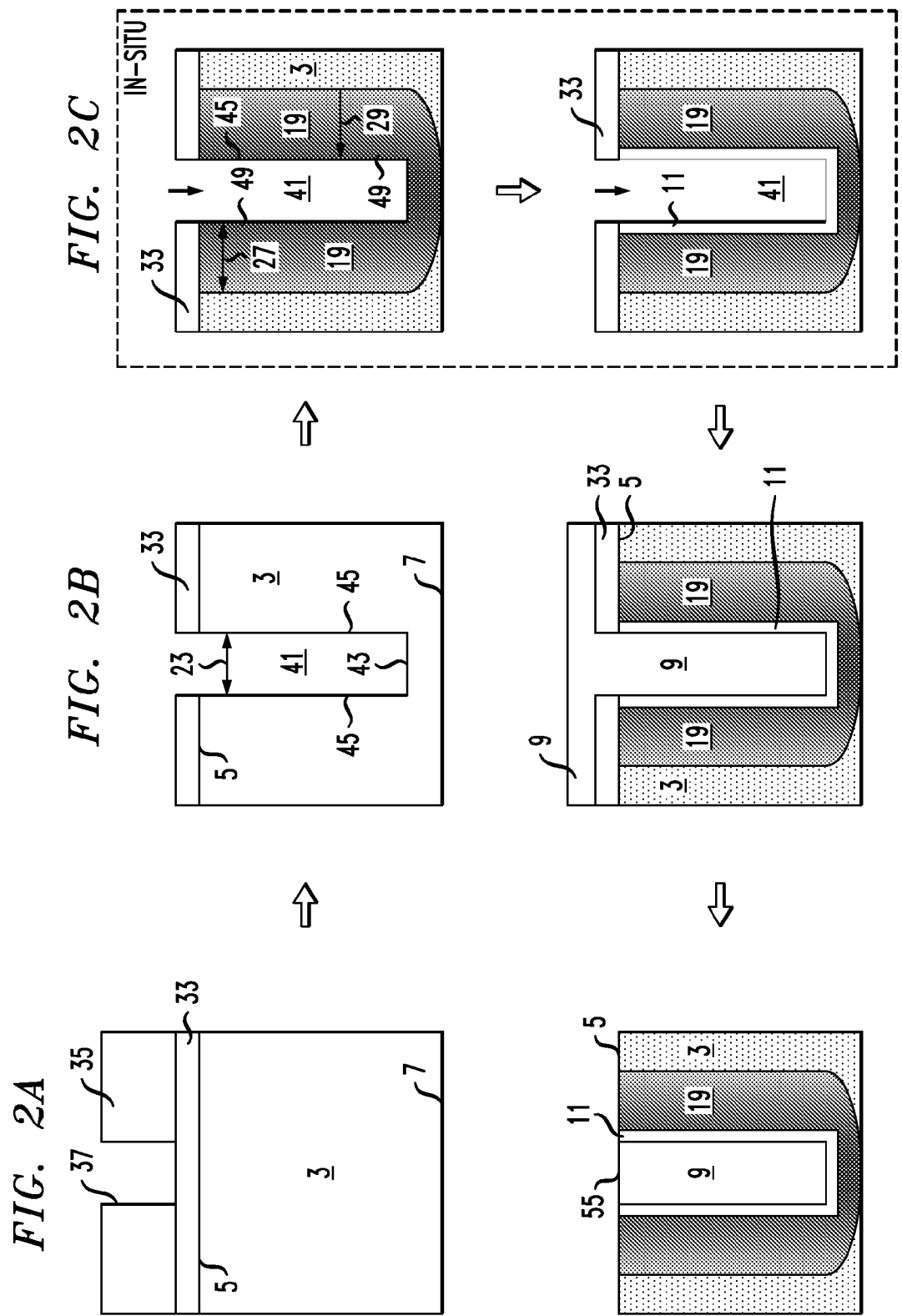
FIGS. 2A-2F are cross-sectional views showing an exemplary sequence of processing operations used to form a filled TSV structure according to the disclosure.

Now turning to FIG. 2A, substrate 3 may be formed of silicon, germanium, or other suitable semiconductor substrate materials used in the semiconductor manufacturing industry. Substrate 3 may be a p-type or an n-type substrate, i.e. it may be doped with a p-type or an n-type dopant material. Various suitable p- and n-type materials are known, available and used in the semiconductor arts. Common p-type semiconductor materials include boron and gallium and common n-type semiconductor materials include phosphorus and arsenic, but these are exemplary only and other suitable dopant impurities may be used. Substrate 3 illustrated in FIG. 2A may include active semiconductor devices already formed thereon in locations not illustrated in FIG. 2A. Hardmask layer 33 is formed over top surface 5 of substrate 3. Hardmask layer 33 may be formed of silicon nitride, silicon oxynitride, or other suitable hardmask materials. Photoresist 35 is formed over hardmask material 33 and is patterned to produce opening 37. Various photoresist materials may be used and photoresist material 35 may be patterned using any of various conventional or other methods. An etching operation is carried out upon the structure shown in FIG. 2A, to produce the structure shown in FIG. 2B.

FIG. 2B shows opening 41 formed within substrate 3 and extending downwardly from top surface 5. Various etching procedures may be used to carry out the TSV etch to produce opening 41 with patterned photoresist material 35 and hardmask material 33 in place. Opening 41 includes width 23 that may range from about 5-15 microns and may be about 8 microns in one exemplary embodiment, but width 23 may vary in other exemplary embodiments. Opening 41 is defined by sidewalls 45 and bottom surface 43. Opening 41 may include a depth from top surface 5 to bottom surface 43 that may range from about 75-100 microns in various exemplary embodiments but other depths may be used in other exemplary embodiments. The depth is chosen so that, after opening 41 is filled with a conductive material to form a filled TSV, a polishing operation is carried out upon bottom surface 7 to recede bottom surface 7 to an extent such that the conductive material within opening 41 is eventually exposed.

One or more thermal diffusion operations is carried out upon the structure shown in FIG. 2B to produce the structure shown in FIG. 2C. Various suitable thermal diffusion operations are known in the art and may be used. The structure shown in FIG. 2C includes well region 19 that surrounds opening 41. Well region 19 may include a width 27 ranging from about 2-20 microns in one exemplary embodiment but other widths may be used in other exemplary embodiments. Well region 19 will be of the opposite dopant impurity type than substrate 3. For example, if substrate 3 is a p-type dopant impurity, well region 19 will be an n-type dopant impurity region. Well region 19 extends to sidewalls 45 and includes the greatest concentration of dopant impurities along sidewalls 45. It can be seen by the shading in FIG. 2C, that well region 19 may include a concentration gradient with the dopant impurity concentration increasing along direction 29. According to one exemplary embodiment, in which substrate 3 is a p-type substrate, well region 19 will be an n-well region and may advantageously include phosphorus as the dopant impurity therein.

According to various exemplary embodiments, after a diffusion operation has been carried out to form well region 19, a further diffusion operation may be carried out using a different or the same dopant species, to produce an inner well and an outer well that each surround opening 41. According to one exemplary embodiment, the two diffusion operations may introduce dopant impurities of the same type, e.g. two n-type dopant impurities and according to another exemplary embodiment, the first diffusion operation may be used to introduce a p-type dopant impurity and the second diffusion operation may be used to introduce an n-type dopant impurity to form an N+ region immediately surrounding opening 41. Examples of double-diffused well regions with different dopant species, will be shown in FIGS. 5 and 6. According to various exemplary embodiments, another diffusion operation may also be carried out upon the structure shown in FIG. 2C using the same dopant impurity species.

Dielectric layer 11 is then formed along sidewalls 45 of opening 41 of the structure shown in FIG. 2C, to produce the structure shown in FIG. 2D. According to one advantageous embodiment, a thermal oxidation operation may be carried out to produce dielectric layer 11 which may be a thermal oxide. Dashed box 51 indicates that the thermal diffusion operation and the thermal oxidation operation used to produce the structures shown in FIGS. 2C and 2D, respectively, may be carried out in-situ. Dielectric layer 11 surrounds opening 41 and well region 19 surrounds dielectric layer 11 as shown in FIG. 2D. Conventional or other thermal oxidation operations may be used. In other exemplary embodiments, dielectric layer 11 may be a dielectric layer of a different material such as an oxynitride or other suitable dielectric materials and may be formed using different processing methods such as chemical vapor deposition, CVD, or other suitable methods.

FIG. 2E shows the structure of FIG. 2D after conductive material 9 has been formed within and filling former opening 41 and over hardmask layer 33. According to another exemplary embodiment, not shown, a barrier layer may be first formed along the exposed surfaces of opening 41, i.e. along dielectric layer 11, and over hardmask 33, prior to the introduction of conductive material 9. Various suitable barrier materials may be used. Conductive material 9 may be copper, tungsten or other suitable conductive materials. Various methods are available in the art and may be used to conformally deposit conductive material 9 over hardmask layer 33 and filling former opening 41. According to one exemplary embodiment, electrochemical plating, ECT, may be used to form conductive material 9 as illustrated.

FIG. 2F shows the structure of FIG. 2E after a polishing operation has been used to remove portions of conductive material 9 and hardmask 33 from over top surface 5 of substrate 3. Chemical mechanical polishing, CMP, or other suitable polishing operations may be used. After polishing, top surface 5 of substrate 3 is exposed and upper surface 55 of conductive material 9 is substantially coplanar with top surface 5.

The structure shown in FIG. 2F is then processed through various interconnect level operations such as the formation and patterning of ILD, interlevel dielectric, and IMD, intermetal dielectric, layers as well as the conductive materials extending through and between these layers to interconnect active semiconductor devices that are includes on substrate 3. After such processing operations are complete, substrate 3 is polished. Substrate 3 will include at least one opening filled with conductive material 9 such as shown in FIG. 2F and in various exemplary embodiments, substrate 3 will include a plurality of such filled structures. The polishing operation polishes bottom surface 7 causing it to recede (upwardly, in the illustrated orientation) and expose a lower portion of conductive material 9. With conductive material 9 extending to polished bottom surface 7, further operations are carried out to produce the structure previously shown in FIG. 1 which shows filled TSV structure 1 in which conductive material 9 extends from top surface 5 to lower surface 7.

Figure 3:
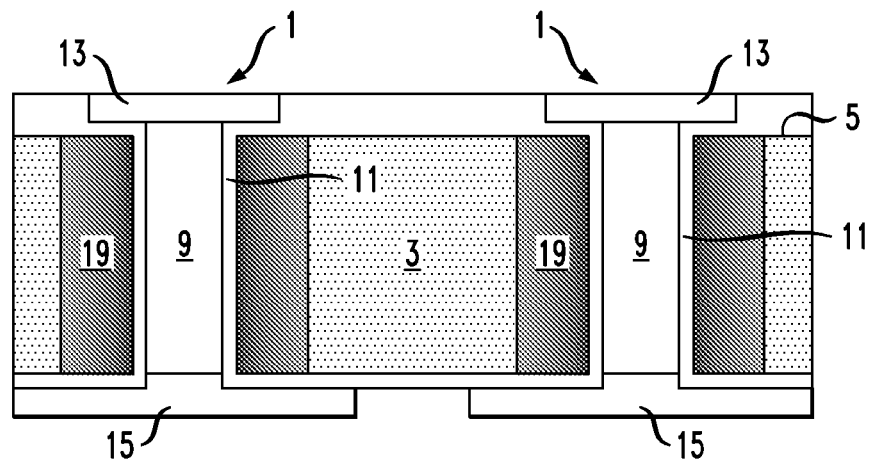
FIG. 3 is a cross-sectional view showing an exemplary dual filled TSV structure according to the disclosure.

FIG. 3 shows an embodiment in which two filled TSV structures 1 are adjacent one another but isolated by well regions 19 and substrate 3. FIG. 3 illustrates the aspect that substrate 3 may include multiple TSV structures 1 formed simultaneously and extending through substrate 3.

Figure 4A:
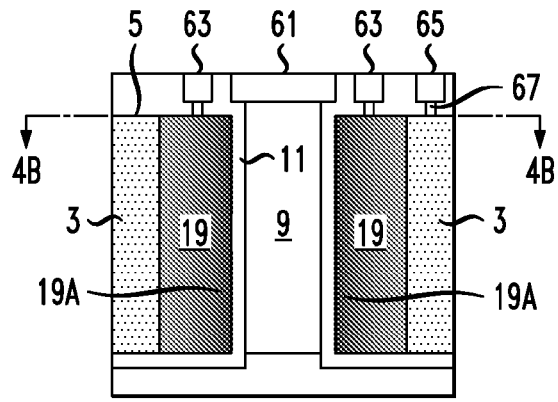
FIGS. 4A and 4B illustrate another exemplary embodiment of a filled TSV structure according to the disclosure.
Figure 4B:
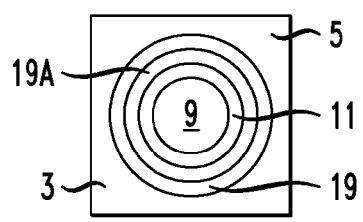

FIGS. 4A and 4B show an embodiment similar to the structure shown in FIG. 1 but in which different electrical connections are provided. In the illustrated embodiment of FIG. 4A, substrate 3 may be a p-type substrate and well region 19 an n-well region. According to this exemplary embodiment, a signal may be coupled to contact pad 61, $V_{DD}$ may be applied to contact pads 63 which contact the n-well, well region 19, and $V_{SS}$ may be applied at contact pad 65 which is coupled to p-type substrate 3. Contact plugs 67 which may be formed of conductive material 9 or other conductive materials, couple the respective contact pad 61, 63 and 65 to the aforementioned components. FIG. 4A also shows portion 19A of well region 19 which includes a higher concentration of the dopant impurities introduced through the sidewalls of opening 41 as described previously. Portion 19A may represent the portion of well region 19 near opening 41 having a greater concentration of dopant impurity due to concentration gradient such as may be produced by a single diffusion operation and described supra. Portion 19A is illustrated to highlight this aspect but it should be understood that there is not necessarily a clear delineation between portion 19A and the rest of well region 19. Rather, portion 19A is provided to illustrate the concentration gradient along direction 29 shown on FIG. 2C.

FIG. 4B shows a plan, top view of the structure shown in FIG. 4A taken along line 4B-4B. FIG. 4B shows top surface 5, conductive material 9, dielectric layer 11 and well region 19 including portion 19A of well region 19.

Figure 5:
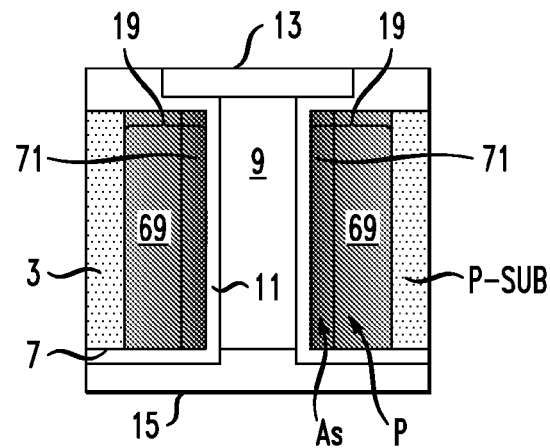
FIG. 5 is a cross-sectional view of an exemplary filled TSV according to the disclosure.

FIG. 5 shows a structure similar to the structure shown in FIG. 1 but is slightly distinguished from the embodiment shown in FIG. 1 because FIG. 5 shows a TSV structure in which well region 19 includes an inner well and an outer well. In the exemplary embodiment of FIG. 5, substrate 3 may be a p-type substrate and well region 19 may include inner well 71 and outer well 69 each being an n-well with an n-type dopant impurity. According to the illustrated embodiment, inner well 71 may be formed of arsenic and outer well 69 formed of phosphorus, but according to other exemplary embodiments, the species may be reversed or different dopant impurities species may be used. In one exemplary embodiment, the arsenic concentration in inner well 71 may be greater than the phosphorus concentration in outer well 69 but in other exemplary embodiments, other relative concentrations may be utilized.

Figure 6:
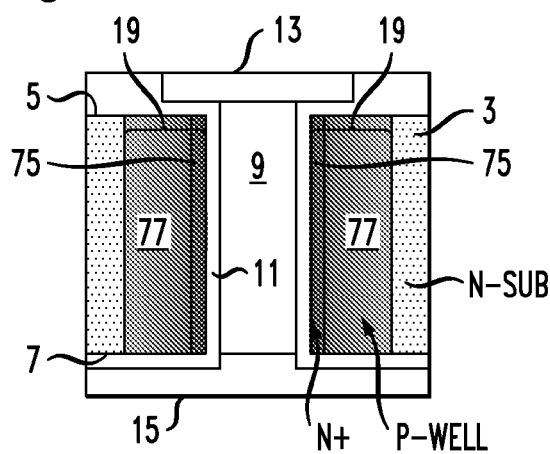
FIG. 6 is a cross-sectional view illustrating another exemplary embodiment of a filled TSV structure according to the disclosure.

FIG. 6 shows another exemplary embodiment in which well region 19 includes two well regions, an inner well region formed of one dopant impurity type and an outer well formed of the opposite dopant impurity type. According to one exemplary embodiment, substrate 3 may be an n-type substrate, i.e. a substrate that includes an n-type dopant impurities therein and well region 19 may include an outer well 77 formed of a p-type dopant impurity and inner well 75 formed of an n-type dopant impurity. According to one exemplary embodiment, inner well 75 may be an N+ region i.e. a region of high n-type dopant impurity concentration, as known to one of ordinary skill in the art. According to other exemplary embodiments, substrate 3 and inner well 77 may each be a p-type material with outer well 77 being an n-type material.

Figure 7:
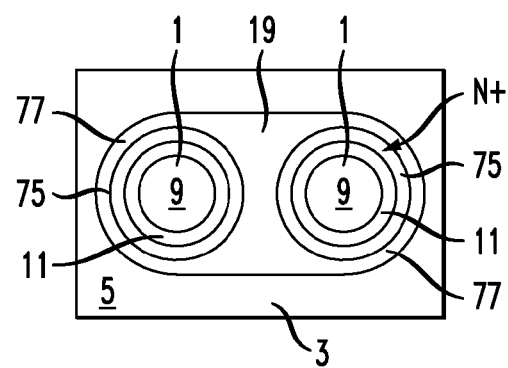
FIG. 7 is a plan view illustrating another exemplary embodiment of a filled TSV structure according to the disclosure.

FIG. 7 is a top view showing an exemplary structure with two adjacent TSV structures 1 and each TSV structure 1 includes centrally disposed conductive portion 9 surrounded by dielectric layer 11. Dielectric layer 11 is surrounded by inner well 75 which is surrounded by outer well 77. Well region 19 includes inner well 75 and outer well 77 and the embodiment of FIG. 7 shows that one well region 19 may include more than one TSV structure 1 therein.

According to one exemplary embodiment, an integrated circuit structure is provided comprising a substrate of a first dopant impurity type, a through silicon via (TSV) extending from a top surface of the substrate to a bottom surface of the substrate and filled with a conductive material, and a well region formed in the substrate surrounding the TSV, the well region comprising a second dopant impurity type.

According to another aspect, provided is an integrated circuit structure comprising a substrate of a first dopant impurity type, a through silicon via (TSV) extending from a top surface of the substrate to an opposed bottom surface of the substrate and filled with a conductive material, a high concentration region of the first dopant impurity type surrounding the TSV and a well region of a second dopant impurity type surrounding the high concentration region. The high concentration region has a first dopant concentration greater than a second dopant concentration in the well region.

According to another aspect, provided is a method for forming a through silicon via (TSV) in an integrated circuit. The method comprises providing a substrate of a first dopant impurity type and including a through silicon via (TSV) extending downwardly from a top surface of the substrate and including sidewalls, thermally diffusing dopant impurities of a second dopant impurity type into the sidewalls thereby forming a well region in the substrate surrounding the TSV, thermally oxidizing the sidewalls and filling the TSV with a conductive plug.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. An integrated circuit structure comprising:
   a substrate of a first dopant impurity type;
   a through silicon via (TSV) extending from a top surface of said substrate to a bottom surface of said substrate and filled with a conductive material; and
   a well region formed in said substrate surrounding said TSV, said well region comprising a second dopant impurity type and extending from said top surface to said bottom surface and including an inner well portion formed of a first species of said second dopant impurity type and an outer portion formed of a second species of said second dopant impurity type.

2. The integrated circuit structure as in claim 1, wherein said first dopant impurity type comprises P-type and said second dopant impurity type comprises N-type.

3. The integrated circuit structure as in claim 1, wherein said well region extends to sidewalls of said TSV.

4. The integrated circuit structure as in claim 1, wherein said TSV includes sidewalls formed of an oxide liner and said well region surrounds said oxide liner.

5. The integrated circuit structure as in claim 1, wherein said substrate comprises a silicon substrate, said TSV includes a width of about 5-15 microns, said well region includes a width of about 2-20 microns and said conductive material comprises one of copper and tungsten.

6. An integrated circuit structure comprising:
   a substrate of a first dopant impurity type;
   a through silicon via (TSV) extending from a top surface of said substrate to an opposed bottom surface of said substrate and filled with a conductive material;
   a high concentration region of said first dopant impurity type surrounding said TSV and a well region of a second dopant impurity type surrounding said high concentration region, said high concentration region having a first dopant concentration greater than a second dopant concentration in said well region and each of said well region and said high concentration region extending from said top surface to said opposed bottom surface of said substrate.

7. The integrated circuit structure as in claim 6, wherein said first dopant impurity type comprises N-type, said second dopant impurity type comprises P-type and said high concentration region comprises an N+ region.

8. The integrated circuit structure as in claim 6, wherein said first dopant impurity type comprises one of arsenic and phosphorous, said second dopant impurity comprises boron and said conductive material comprises one of copper and tungsten.

9. The integrated circuit structure as in claim 6, wherein said high concentration region extends to a dielectric layer formed along sidewalls of said TSV.

10. The integrated circuit structure as in claim 6, wherein said TSV includes sidewalls formed of an oxide liner and said high concentration region adjacently surrounds said oxide liner.

11. The integrated circuit structure as in claim 6, further comprising a second TSV extending from said top surface of said substrate to said opposed bottom surface of said substrate, disposed within said well region and surrounded by a further high concentration region of said first dopant impurity type.

12. The integrated circuit structure as in claim 1, wherein said first species of said second dopant impurity type comprises As and said second species of said second dopant impurity type comprises phosphorous.

13. The integrated circuit structure as in claim 1, wherein said first species of said second dopant impurity type comprises phosphorous and said second species of said second dopant impurity type comprises As.

* * * * *